(12) United States Patent
Chan

(10) Patent No.: US 8,492,285 B2
(45) Date of Patent: Jul. 23, 2013

(54) METHOD FOR PLASMA TEXTURING

(75) Inventor: Boon Teik Chan, Penang (MY)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/233,958

(22) Filed: Sep. 15, 2011

(65) Prior Publication Data

US 2012/0060915 A1 Mar. 15, 2012

Related U.S. Application Data

(63) Continuation of application No. PCT/EP2009/059938, filed on Jul. 31, 2009.

(60) Provisional application No. 61/161,013, filed on Mar. 17, 2009.

(51) Int. Cl.
*H01L 21/302* (2006.01)

(52) U.S. Cl.
USPC .......... 438/710; 216/24; 216/67; 216/69; 216/74; 216/79; 438/706; 438/714; 438/719; 438/734; 257/E21.218

(58) Field of Classification Search
USPC .................................. 257/E21.218
See application file for complete search history.

(56) References Cited

U.S. PATENT DOCUMENTS

| | | | |
|---|---|---|---|
| 6,069,091 A | 5/2000 | Chang et al. | |
| 6,091,021 A | 7/2000 | Ruby et al. | |
| 6,329,296 B1 | 12/2001 | Ruby et al. | |
| 7,128,975 B2 | 10/2006 | Inomata | |
| 2005/0126627 A1 | 6/2005 | Hayashida | |
| 2007/0128761 A1 | 6/2007 | Owada et al. | |

FOREIGN PATENT DOCUMENTS

EP 1840966 A1 10/2007

OTHER PUBLICATIONS

J. Yoo et al. "RF texturing optimization for thin c-Si solar cells in $SF_6/O_2$ plasma", Journal of Physics D: Applied Physics, vol. 41 (2008) 125205.*
J. Rentsch et al., Isotropic plasma texturing of mc-Si for industrial solar cell fabrication, Proceedings of Photovoltaic Specialists Conference, IEEE, 2005, pp. 1316-1319.*
H. Dekkers, et al. "Plasma Texturing Processes for the next generation of crystalline Si solar cells", Proceedings of 21st European Photovoltaic Solar Energy Conference, 2006, pp. 754-757.*

(Continued)

*Primary Examiner* — Lan Vinh
*Assistant Examiner* — Jiong-Ping Lu
(74) *Attorney, Agent, or Firm* — Knobbe Martens Olson & Bear LLP

(57) ABSTRACT

A dry etching method for texturing a surface of a substrate is disclosed. The method includes performing a first dry etching onto the surface of the substrate thereby forming a surface texture with spikes and valleys, the first dry etching comprising etching the surface of the substrate in a plasma comprising fluorine (F) radicals and oxygen (O) radicals, wherein the plasma comprises an excess of oxygen (O) radicals. The method may further include performing a second dry etching onto the surface texture thereby smoothening the surface texture, the second dry etching comprising chemical isotropic etching the surface texture, obtained after the first dry etching, in a plasma comprising fluorine (F) radicals, wherein the spikes are etched substantially faster than the valleys.

19 Claims, 5 Drawing Sheets

OTHER PUBLICATIONS

S.H. Zaidi et al., "Characterization of random reactive ion etched-textured silicon solar cells", IEEE Transactions on Electron Devices, vol. 48, No. 6, Jun. 2001, pp. 1200-1206.

Dekkers et al., "Plasma texturing processes for the next generations of crystalline Si solar cells", Proceedings of the 21$^{st}$ European Photovoltaic Solar Energy Conference, 2006, pp. 754-757.

Arana et al., "Isotropic etching of silicon in fluorine gas for MEMS micromachining; Isotropic etching of silicon in fluorine gas", Journal of Micromechanics & Microengineering, Institute of Physics Publishing, Bristol, GB, vol. 17, No. 2, Feb. 1, 2007, pp. 384-392.

International Search Report for International application No. PCT/EP2009/059938 mailed Feb. 1, 2010 by European Patent Office.

* cited by examiner

METHOD FOR PLASMA TEXTURING

CROSS REFERENCE TO RELATED APPLICATIONS

This application is a continuation of PCT Application No. PCT/EP2009/059938, filed Jul. 31, 2009, which claims priority under 35 U.S.C. §119(e) to U.S. provisional patent application 61/161,013 filed on Mar. 17, 2009. Each of the above applications is incorporated herein by reference in its entirety.

BACKGROUND OF THE INVENTION

1. Field of the Invention

The disclosed technology relates to a method for plasma texturing of a surface of a substrate (e.g., a silicon substrate), which may be used in an industrial process for texturing a surface of silicon photovoltaic cells.

2. Description of the Related Technology

Surface texturing of photovoltaic cells is used to increase the cell short-circuit current and thus the cell efficiency by reducing the reflection of incident light. Several texturing techniques have been proposed, such as wet chemical etching, dry plasma etching and mechanical texturing.

For single crystalline or monocrystalline silicon substrates surface texturing can be obtained by using a wet anisotropic etchant, such as for example a solution of NaOH or KOH with the addition of isopropanol for wettability improvement. Typically pyramid structures with a height in the range of 3 to 5 micrometer are formed. Alkaline texturing is not effective on multi-crystalline silicon and ribbon silicon substrates because of the random crystallographic orientation of the silicon lattice and because of the crystal orientation dependence of the etching process.

Acidic texturing or iso-texturing of multicrystalline silicon substrates can for example be obtained with acid mixtures based on HF and $HNO_3$ in $CH_3CO_2H$ or in water. The acid texturing requires defects at the surface to initialize the etching process. Thus, for example saw damage can be removed simultaneously with creating a surface texture. Acidic texturing has some disadvantages: the texture formation relies on surface damage, it is difficult to create single side surface texturing, acid texturing removes several micrometers of silicon material (typically 5 to 7 micrometer at each side) and is therefore difficult to apply on thin film silicon solar cells such as epitaxial cells wherein the thickness of the epitaxial layers is typically in the range between 2 and 6 micrometer, and chemical waste treatment is required for the hazardous etch products.

In some photovoltaic technologies, e.g. technologies with rear-side surface passivation such as the i-PERC technology, there is a need for single side texturing, wherein only the front side of the photovoltaic cells is textured. Wet texturing processes such as alkaline texturing and acidic texturing are not well suited for single side texturing.

Mechanical texturing, based on forming grooves with a diamond saw blade, has been proposed for single side texturing. However this method leads to high mechanical stresses and metal interruptions due to the deep structures. Furthermore, it is not cost effective, has a low throughput and is not applicable for very thin solar cells.

Plasma texturing offers a method that allows single side surface texturing, that allows low silicon removal rates and thus may be used on thin cells, that can be used on damage-free substrates, that is independent on crystal orientation and that has high throughput and low cost of ownership. RIE (Reactive Ion Etching) plasma texturing methods, based on ion bombardment of the silicon surface, have been developed using $SF_6$ and $O_2$ (e.g. U.S. Pat. No. 6,091,021 and U.S. Pat. No. 6,329,296) or using $SF_6$, O2 and $Cl_2$ (e.g. U.S. Pat. No. 7,128,975). However, it is known that RIE plasma texturing causes damage to the silicon surface due to ion bombardment, resulting in a significant degradation of the Internal Quantum Efficiency and the open-circuit voltage. This is for example reported by S. H. Zaidi et al in "Characterization of random reactive ion etched-textured silicon solar cells", IEEE Transactions on Electron Devices, Vol. 48, No. 6, 2001. Therefore, after RIE plasma texturing, there is a need for removing the surface damage caused by the texturing step. The most effective means of recovering a damage-free silicon surface was found to be isotropic wet chemical etching, thereby removing the damaged layer. However, in an industrial environment the need for such a wet etching may be an important drawback.

In "Plasma texturing processes for the next generations of crystalline Si solar cells", Proceedings of the 21st European Photovoltaic Solar Energy Conference, 2006, p 754, H. F. W. Dekkers et al. report a plasma texturing process based on microwave plasma excitation with low ion flux and low impact energy on the substrate. In this way ion impact on the substrate can be substantially reduced as compared to e.g. RIE plasma texturing, and surface damage caused by ion bombardment can be substantially avoided. However, it is shown that after microwave plasma texturing using an $SF_6$/$N_2O$ plasma a sponge-like texture with varying quality over the substrate area is obtained. It is suggested that an industrial process with large throughput and with a good uniformity over large areas can be obtained by adding a second plasma etching using a $Cl_2$ plasma. Using this second step may transform the surface roughness induced in the first step into a more uniform texture, based on an anisotropic etching effect. However, it is a disadvantage of this method that $Cl_2$ is used, a hazardous, toxic and corrosive gas.

SUMMARY OF CERTAIN INVENTIVE ASPECTS

A dry etching method for texturing a surface of a substrate, the method comprises performing a first dry etching, the first dry etching comprising etching the surface in a plasma comprising F radicals and O radicals with a surplus of O radicals, thereby forming a surface texture with spikes and valleys. The method further comprises performing a second dry etching, the second dry etching comprising chemical isotropic etching with F radicals, wherein the spikes are etched substantially faster than the valleys, thereby smoothening the surface texture.

The dry etching method according to the above, wherein the first dry etching comprises etching in a SF6/N2O-based plasma.

The dry etching method according to the above, wherein the SF6/N2O gas ratio is in the range between about 0.2 and 1.5.

The dry etching method according to the above, wherein the first dry etching is performed at a pressure lower than about 500 microbar.

The dry etching method according to the above, wherein the second dry etching comprises etching in a plasma comprising a diluting gas.

The dry etching method according to the above, wherein the diluting gas comprises Ar.

The dry etching method according to the above, wherein the second dry etching is performed in a SF6/Ar-based plasma.

The dry etching method according to the above, wherein the SF6/Ar ratio is in the range between about 0.05 and 0.5.

The dry etching method according to the above, wherein the second dry etching is performed at a pressure that is higher than the pressure during the first dry etching.

The dry etching method according to the above, wherein the second dry etching is performed in a SF6/N2O-based plasma.

The dry etching method according to the above, wherein the second dry etching is performed at a pressure higher than about 500 microbar.

The dry etching method according to the above, wherein the method is performed without confinement of radicals towards the substrate.

Use of a method according to the above in a process for fabricating photovoltaic cells.

According to one inventive aspect, there is a dry etching method for texturing a surface of a substrate, wherein the method comprises: a) performing a first dry etching onto the surface of the substrate thereby forming a surface texture with spikes and valleys, the first dry etching comprising (or consisting of) etching the surface of the substrate in a plasma comprising (or consisting of) fluorine (F) radicals and oxygen (O) radicals, wherein the plasma comprises an excess (or surplus) of oxygen (O) radicals; and b) performing a second dry etching onto the surface texture thereby smoothening the surface texture, the second dry etching comprising (or consisting of) chemical isotropic etching the surface texture obtained according to process a) in a plasma comprising (or consisting of) fluorine (F) radicals, whereby the spikes are etched substantially faster than the valleys.

In one inventive aspect, the plasma comprising (or consisting of) fluorine (F) radicals and oxygen (O) radicals, used for performing the first dry etching, is provided by a mixture of (etchant) gasses comprising (or consisting of) a fluorine comprising gas and an oxygen comprising gas, wherein the fluorine comprising gas preferably comprises (or consists of) $SF_6$, $COF_2$, $CF_4$, $NF_3$, $SiF_4$, $F_2$ diluted in $N_2$, or any combinations thereof; and the oxygen comprising gas preferably comprises (or consists of) $N_2O$, $O_2$, or any combinations thereof.

Preferably, the gas ratio between the fluorine comprising gas and the oxygen comprising gas used in the first dry etching, is comprised between about 0.2 and 1.0, particularly between about 0.3 and 0.7, more particularly between about 0.4 and 0.6, more particularly the gas ratio between the fluorine comprising gas and the oxygen comprising gas is about 0.5.

In one inventive aspect, the first dry etching comprises (or consists of) etching the surface of the substrate in a plasma comprising (or based on) a mixture comprising (or consisting of) $SF_6$ and $N_2O$. According to this preferred method, the $SF_6/N_2O$ gas ratio is between about 0.2 and 1.0, particularly between about 0.3 and 0.7, more particularly between about 0.4 and 0.6, more particularly the $SF_6/N_2O$ gas ratio is about 0.5.

In one inventive aspect, the first dry etching is performed at a working pressure between about 0.5 microbar and 1000 microbar, preferably between about 50 microbar and 500 microbar, more particularly between about 50 microbar and 300 microbar, even more particularly between about 250 microbar and 300 microbar, and more particularly at about 300 microbar.

In one inventive aspect, the first dry etching is performed at a working pressure lower than about 500 microbar.

The plasma comprising fluorine (F) radicals, used for performing the second dry etching, may be provided by a mixture (of etchant gasses) comprising (or consisting of) a fluorine comprising gas, wherein the fluorine comprising gas preferably comprises (or consists of) $SF_6$, $COF_2$, $CF_4$, $NF_3$, $SiF_4$, $F_2$ diluted in $N_2$, or any combinations thereof.

The second dry etching may comprise (or consist of) etching in a plasma comprising a diluting gas, wherein the diluting gas preferably comprises (or consists of) Ar, He, Ne, Kr, halogen element comprising gases, or any combinations thereof. More preferably, the diluting gas comprises Ar.

In one inventive aspect, the gas ratio between the fluorine comprising gas and the diluting gas is between about 0.05 and 0.5, more particularly between about 0.05 and 0.3, more particularly between about 0.1 and 0.15, more particularly is about 0.13.

In one inventive aspect, the second dry etching is performed in a plasma comprising (or based on) a mixture comprising (or consisting of) $SF_6$ and Ar. The $SF_6/Ar$ gas ratio may be between about 0.05 and 0.5, particularly between about 0.05 and 0.3, more particularly between about 0.1 and 0.15, and more particularly the $SF_6/Ar$ gas ratio between the fluorine comprising gas and the diluting gas is about 0.13.

In one inventive aspect, the second dry etching is performed at a working pressure comprised between about 100 microbar and 1000 microbar, particularly between about 150 microbar and 500 microbar, more particularly between about 150 microbar and 300 microbar, even more particularly between about 200 microbar and 300 microbar, and more particularly at about 250 microbar.

The second dry etching may be performed at a working pressure that is higher than the working pressure used during the first dry etching, preferably the second dry etching is performed at a working pressure that is higher than about 500 microbar, more preferably higher than about 1000 microbar. The plasma comprising (or consisting of) fluorine (F) radicals, used for performing the second dry etching may be provided by a mixture of (etchant) gasses comprising (or consisting of) a fluorine comprising gas and an oxygen comprising gas, wherein the fluorine comprising gas preferably comprises (or consists of) $SF_6$, $COF_2$, $CF_4$, $NF_3$, $SiF_4$, $F_2$ diluted in $N_2$, or any combinations thereof; and the oxygen comprising gas preferably comprises (or consists of) $N_2O$, $O_2$, or any combinations thereof.

The method may be performed in a reactor with a microwave induced plasma without confinement of radicals towards the substrate.

Another inventive aspect relates to the use of a method as above described for the manufacture of photovoltaic cells.

Advantageously, the method as above described is used for the manufacture of (i-PERC) photovoltaic cells.

In still another inventive aspect, there is a photovoltaic cell made on a substrate textured according to the method as above described.

The foregoing inventive aspects, both as to organization and method of operation, together with features and advantages thereof, may best be understood by reference to the following detailed description when read with the accompanying drawings.

BRIEF DESCRIPTION OF THE DRAWINGS

FIG. 1 schematically illustrates a surface with a texture comprising sharp and steep spikes, with valleys in between.

DETAILED DESCRIPTION OF CERTAIN ILLUSTRATIVE EMBODIMENTS

Figure 1:

In the following detailed description, numerous specific details are set forth in order to provide a thorough understanding of the invention and how it may be practiced in particular embodiments. However it will be understood that the present invention may be practiced without these specific details. In other instances, well-known methods, procedures and techniques have not been described in detail, so as not to obscure the present invention. While the present invention will be described with respect to particular embodiments and with reference to certain drawings, the reference is not limited hereto. The drawings included and described herein are schematic and are not limiting the scope of the invention. It is also noted that in the drawings, the size of some elements may be exaggerated and, therefore, not drawn to scale for illustrative purposes.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Moreover, the terms top, bottom, over, under and the like in the description are used for descriptive purposes and not necessarily for describing relative positions. It is to be understood that the terms so used are interchangeable under appropriate circumstances and that the embodiments of the invention described herein are capable of operation in other orientations than described or illustrated herein.

Certain embodiments relate to a method for plasma texturing of a surface of a substrate, such as a silicon substrate, wherein the method provides a good (or improved) surface texture on a surface of a substrate when compared to methods described in the art.

More specifically, certain embodiments relate to a method which is particularly adapted and advantageous for texturing a surface of photovoltaic cells, such as silicon photovoltaic cells.

It has been surprisingly found that, when compared to methods described in the art, a good (or improved) electrical performance and a good (or improved) balance between short-circuit current density and open-circuit voltage are achieved for photovoltaic cells made on a substrate textured according to certain embodiments described herein.

In one embodiment, the need for removing surface damage after dry etching is advantageously avoided.

In one embodiment, the need of using hazardous, toxic or corrosive gases, such as e.g. Cl-containing gases, is avoided.

In one embodiment, it is provided a dry etching method for forming a good (or improved) surface texture on a surface of a substrate (when compared to methods described in the art), e.g. silicon substrate, wherein the method yields a good (or improved) electrical performance and a good (or improved) balance between short-circuit current density and open-circuit voltage for photovoltaic cells made on a substrate textured according to one inventive aspect.

In another aspect, the need for removing surface damage after dry etching is avoided. In another aspect, the need for Cl-containing gases is avoided.

The term "short-circuit current density" is herewith meant to designate the current flowing freely through an external circuit having no load or resistance per unit area of the corresponding photovoltaic cell (or the short circuit current generated per square cm).

The term "open-circuit voltage" is herewith meant to designate the difference of electrical potential between two terminals of a device when there is no external load connected, i.e. the circuit is broken or open.

The term "internal quantum efficiency" is meant to designate the ratio of the number of charge carriers collected by the photovoltaic cell to the number of photons of a given energy that are absorbed by the photovoltaic cell.

One embodiment relates to a dry etching method for texturing a surface of a substrate, wherein the method comprises (or consists of):

a) performing a first dry etching onto the surface of the substrate thereby forming a surface texture with spikes and valleys, the first dry etching comprising (or consisting of) etching the surface of the substrate in a plasma comprising (or consisting of) fluorine (F) radicals and oxygen (O) radicals, wherein the plasma comprises an excess (or surplus) of oxygen (O) radicals; and b) performing a second dry etching onto the surface texture thereby smoothening the surface texture, the second dry etching comprising (or consisting of) chemical isotropic etching the surface texture obtained according to step a) in a plasma comprising (or consisting of) fluorine (F) radicals, whereby the spikes are etched substantially faster than the valleys.

The expression "etching the surface of a substrate in a plasma" means that while performing the etching (or during etching) the surface of the substrate is exposed (or subjected) to the plasma (comprising among others species radicals originating from etchant gases).

It is to be understood that the radicals in the plasma are provided by the (etchant) gases used to form the plasma.

The term "excess (or surplus) of oxygen radicals" is herewith meant to express that the ratio between oxygen (O) radicals and fluorine (F) radicals is larger than 1.

It is well within the capabilities of the person skilled in the art to produce a plasma comprising (or consisting of) fluorine (F) radicals and oxygen (O) radicals, wherein the plasma comprises an excess of oxygen (O) radicals.

One embodiment relates to a method for plasma texturing of a surface of a semiconductor, e.g. silicon, substrate wherein the method leads to a good (or improved) surface texture (when compared to methods described in the art).

When using the method of one embodiment for texturing a surface of photovoltaic cells, a good (or improved) electrical performance, i.e. a good (or improved) short-circuit current density $J_{sc}$ and a good (or improved) open-circuit voltage $V_{oc}$, of the photovoltaic cells can be obtained (when compared to methods described in the art).

It is an advantage of certain embodiments of the method that surface damage, e.g. surface damage resulting from ion bombardment, is avoided, and thus the need for removing surface damage after plasma texturing is avoided.

It is another advantage of one embodiment of the method that the need for Cl-containing gases is avoided.

One embodiment of the method can be used on different types of substrate materials, e.g. silicon substrate materials, such as monocrystalline silicon, polycrystalline silicon (having grain sizes in the range between about 200 nm and 100 micrometer), multicrystalline silicon (having grain sizes larger than about 100 micrometer, e.g. in the order of millimeters or centimeters), epitaxial silicon or silicon ribbons.

In one embodiment, a method comprises performing two subsequent dry etching steps, wherein the first dry etching step comprises etching the surface of the substrate in a plasma comprising fluorine (F) radicals and oxygen (O) radicals with a surplus (excess) of O radicals, thereby forming a rough surface texture with spikes and valleys, and wherein the second dry etching step comprises chemical isotropic etching with fluorine (F) radicals, wherein the spikes are etched substantially faster than the valleys, thereby smoothening the surface texture.

The method is preferably performed in a reactor wherein surface damage is avoided by avoiding or limiting ion bombardment of the surface. The method can for example be performed in a reactor with a microwave induced plasma without confinement of radicals to the substrate.

A method for plasma texturing according to one embodiment comprises at least two steps.

A first step comprises chemical etching of the silicon surface in a plasma comprising fluorine (F) radicals and oxygen (O) radicals with a surplus (or excess) of oxygen (O) radicals (i.e. wherein the ratio between oxygen (O) radicals and fluorine (F) radicals is larger than 1).

Without wishing to be bound by theory, it is believed that in this first step an equilibrium is established between two mechanisms: (1) etching of the silicon surface by chemical reaction of fluorine (F) radicals with the silicon and formation of $SiF_4$; and (2) redeposition of oxidized reaction products on the silicon surface, whereby a silicon fluorine oxide ($SiF_xO_y$) layer is formed locally. The silicon fluorine oxide ($SiF_xO_y$) layer refers to a layer comprising mainly silicon, fluorine, and oxygen. The integers x and y indicate that the ratio of silicon, fluorine, and oxygen in the layer is not fixed.

The local redeposition of reaction products leads to a micro-masking effect such that a textured surface can be obtained. The first step of a method results in a very rough silicon surface with sharp and steep peaks or spikes, with valleys in between, as schematically illustrated in FIG. 1.

The first dry etching of a method according to one embodiment may for example be performed in a $SF_6/N_2O$-comprising plasma (or otherwise referred to throughout the description as a plasma provided by a mixture comprising $SF_6$ and $N_2O$).

The first dry etching of a method according to one embodiment may for example be performed in a $SF_6/N_2O$-based plasma (or otherwise referred to throughout the description as a plasma based on a mixture comprising $SF_6$ and $N_2O$). Other mixtures can be used. For example, $SF_6$ can be replaced by other gases such as $COF_2$, $CF_4$, $NF_3$, $SiF_4$ or $F_2$ diluted in $N_2$ and/or $N_2O$ can be replaced by $O_2$.

A typical gas ratio between $SF_6$ and $N_2O$ is in the range between about 0.2 and 1.5, e.g. (preferably) in the range between about 0.3 and 0.7, e.g. (more preferably) about 0.5.

The pressure is typically in the range between about 0.5 microbar and 1000 microbar, e.g. (preferably) in the range between about 50 microbar and 500 microbar, e.g. (more preferably) in the range between about 50 microbar and 300 microbar.

The etching time of this first dry etching can be controlled for obtaining the lowest reflectivity at a wavelength of e.g. (preferably) about 600 nm or 700 nm, and is typically in the range between about 1 and 4 minutes.

A second step of a method according to one embodiment comprises chemical isotropic etching by means of radicals, e.g. (preferably) F radicals, of the spiky textured surface resulting from the first step, wherein the radicals used for etching are controlled to etch mainly the peaks of the spiky textured surface, and much less the valleys in between the spikes.

Controlling the fluorine (F) radicals may be based on controlling the fluorine (F) radical density, controlling the plasma composition and/or controlling the working pressure.

The term "working pressure" is meant to refer to the pressure inside the reactor during etching.

Controlling the F radical density may comprise lowering the F radical density, because at a lower F radical density the probability that peaks are etched faster than valleys increases.

Controlling the plasma composition may comprise diluting the plasma, e.g. (preferably) with an inert gas such as (preferably) Ar, thereby increasing the pressure in the chamber (or reactor) and reducing the lifetime of the F radicals.

Controlling the working pressure may comprise increasing the working pressure: a higher working pressure leads to a lower radical lifetime and thus less penetration of F radicals into the valleys.

The second dry etching of a method according to one embodiment can be performed in a plasma comprising a diluting gas such as e.g. (preferably) Ar. For example, a gas mixture comprising $SF_6$ and Ar can be used.

The $SF_6$/Ar gas ratio may for example be in the range between about 0.05 and 0.5, e.g. (preferably) in the range between about 0.05 and 0.3, e.g. (more preferably) in the range between about 0.1 and 0.15. Other gas mixtures can be used during the second dry etching, e.g. $SF_6$ can be replaced by other gases such as (preferably) $COF_2$, $CF_4$, $NF_3$, $SiF_4$ or $F_2$ diluted in $N_2$ and/or Ar can be replaced by noble gases such as (preferably) He, Ne, Kr, Xe or halogen element containing gases.

One embodiment of the method is further described for a process that is performed on silicon substrates in a reactor wherein a plasma is generated by microwave-powered antennas and wherein no confinement (RF, voltage, magnetic, . . . ) of the plasma towards the substrate is used. However, the method can also be performed in other plasma reactors with different process conditions.

A remote linear microwave plasma reactor XCD-724 from Secon Semiconductor, wherein a plasma is generated by microwave powered antennas, was used for performing plasma texturing experiments.

Figure 2:
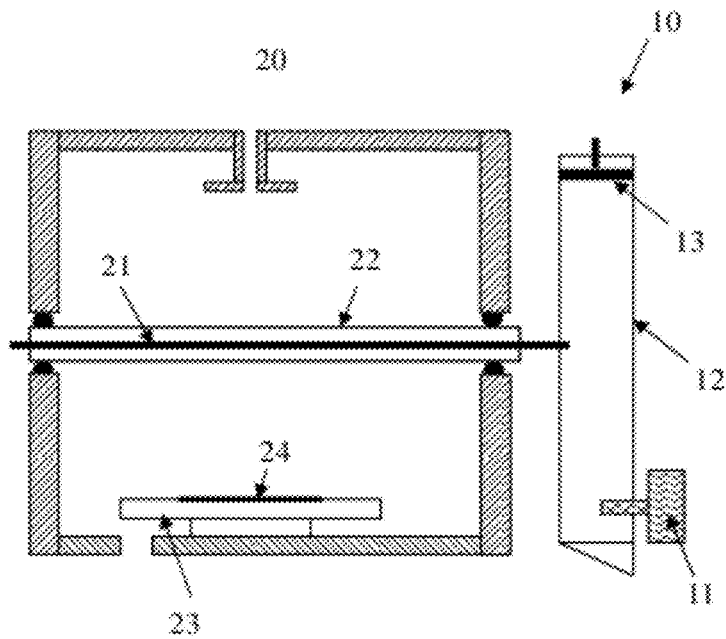
FIG. 2 is a schematic drawing of a linear microwave plasma source and reactor.

A schematic drawing of the linear microwave plasma source 10 and reactor 20 is shown in FIG. 2.

Figure 3:
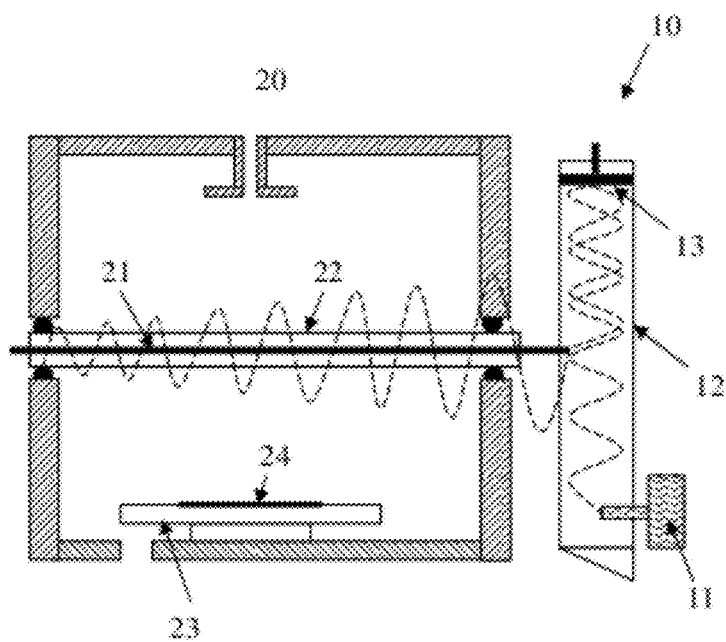
FIG. 3 illustrates the interaction of surface waves in the coaxial system of a microwave plasma reactor.

As illustrated in FIG. 2, electromagnetic waves with a frequency of 2.45 GHz are produced by a 1250 W magnetron 11. The linear microwave plasma source 10 comprises: a 1250 W magnetron 11, an azimuthally symmetric waveguide cavity 12, an (inner) conductor 21, a non-conducting dielectric tube (or rod) 22, and a shortcut plate 13. (The waveguide-surfatron is a surface-wave launcher comprising a waveguide and a coaxial line element). The microwaves propagate along an azimuthally symmetric waveguide cavity 12 and are coupled to a stainless steel antenna (or (inner) conductor) 21. A shortcut plate 13 at the end of the (waveguide) cavity 12 opposite to the magnetron 11 is adjusted (¼ of the microwave wavelength) to generate reflected surface waves, as illustrated in FIG. 3. Both waves are superposed in the (discharge) (inner) conductor (or stainless steel antenna) 21 which is perpendicular to the wall of the waveguide (cavity) 12 (surfaguide launcher). The (inner) conductor 21 is placed at a central axis of a non-conducting dielectric tube 22, e.g. a ceramic (such as $Al_2O_3$) tube or rod 22, mounted above the substrate chuck. The dielectric tube or ceramic rod 22 is cooled by compressed air at atmospheric pressure. A plasma is produced in the reactor 20, outside the ceramic rod 22 forming the outer conductor. It is preferred that the superposition of surface waves is adjusted to maximize the plasma column length or to maximize the coupling efficiency of the launcher. The plasma source 10 used in the experiments (as further described) comprises two ceramic rods 22 (only one is shown in FIG. 2) with a diameter of 20 mm integrated into (or with) a waveguide cavity 12 that is powered by a 2× Magnetron 11 (1250 W/2.45 GHz).

Plasma is generated in the plasma reactor 20, outside the dielectric tubes 22. The microwaves generating the plasma propagate as surface waves mainly in the region between the inner conductor 21 and the dielectric tube 22 and in a region around the dielectric tube. These microwaves give rise to plasma generation only in a region around the dielectric tube. The size of the surface waves region is determined by the microwave power. The region where a plasma is generated depends on the electron distribution, which depends on the working pressure, the gas composition and the microwave power. In order to achieve a good homogeneous plasma density along the ceramic rod 22 and thus a good uniformity of plasma etching along the ceramic rod 22, two microwave surface waves propagating in opposite direction can be provided, i.e. two magnetrons 11 can be provided, one at each end of the ceramic rod 22. In the plasma reactor 20 illustrated in FIG. 2, radicals are not confined to a specific region, and the substrate is not biased by any external potential. Therefore, the ion impact damage on the substrate, if present, is expected to be very limited.

Etching experiments were performed with a continuous mode microwave plasma on polished 4" FZ (Floatzone) silicon substrates.

Figure 4:
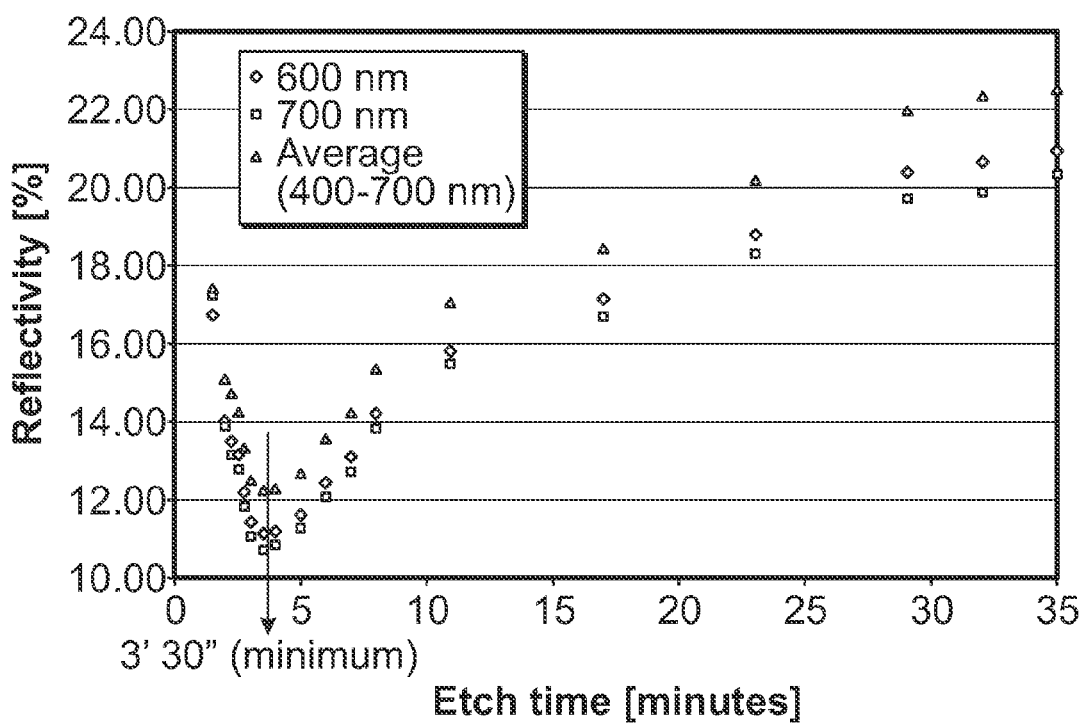
FIG. 4 shows the reflectivity of monocrystalline Floatzone (FZ) silicon substrates after plasma etching in an $SF_6/N_2O$ based plasma, as a function of the etching time.

An $SF_6/N_2O$ based plasma (or otherwise referred to throughout the description as a plasma based on a mixture comprising $SF_6$ and $N_2O$) was used with a surplus (or excess) of oxygen content in the gas ratio. Without wishing to be bound by theory, it is believed that fluorine radicals etch the silicon while oxygen oxidizes the silicon of the silicon-fluorine etching residues. These oxides are locally re-deposited and their locally and temporally masking leads to a dynamic equilibrium that can lead to a texture formation. After plasma etching, the reflectivity of the substrates was evaluated for different wavelengths and as a function of the etching time. Results are shown in FIG. 4 for a wavelength of 600 nm and 700 nm, as well as the average reflection for the wavelength range between 400 nm and 700 nm. For the example shown, a minimum reflectivity is obtained after 3'30" $SF_6/N_2O$ etching. The etching time needed for obtaining minimum reflectivity can depend e.g. on the surface properties of the substrate, e.g. the initial roughness of the substrate.

However, optimizing a texturing process for photovoltaic cells based on achieving the lowest reflectivity may not be a good approach. Besides a low reflection also a low defect density and a good surface quality is preferred. Therefore, there is a need for making a trade-off between low reflectivity (and thus good short-circuit current density) and low surface recombination velocity (and thus good open-circuit voltage).

Figure 5:
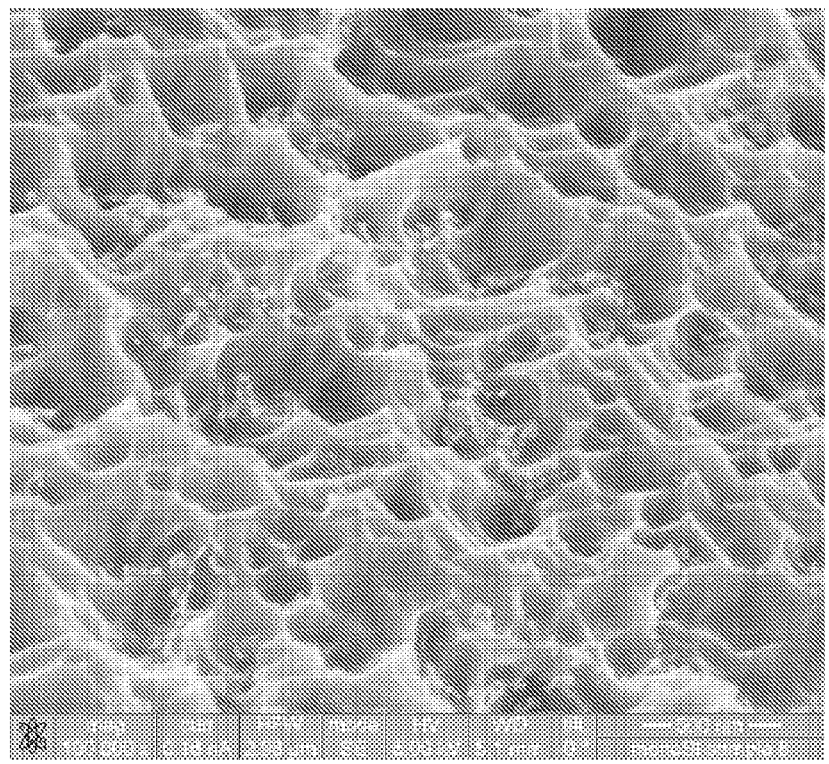
FIG. 5 shows a SEM picture of a monocrystalline silicon substrate after plasma etching in an $SF_6/N_2O$ based plasma.
Figure 6:
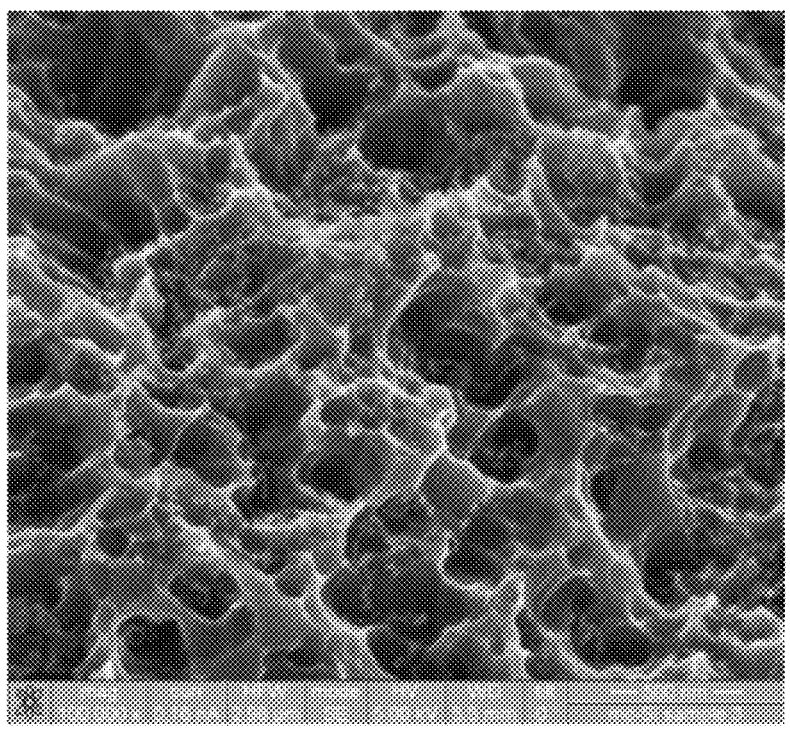
FIG. 6 shows a SEM picture of a multicrystalline silicon substrate after plasma etching in an $SF_6/N_2O$ based plasma.

As illustrated in the SEM pictures of FIG. 5 (monocrystalline silicon) and FIG. 6 (multicrystalline silicon) a very rough surface with a spiky surface texture is created by the $SF_6/N_2O$ etching process. The surface comprises sharp and steep peaks or spikes, with valleys in between the spikes (as illustrated in FIG. 1). Such sharp peaks are not desired because sharper and steeper peaks or spikes lead to a larger silicon surface area, resulting in a higher surface recombination and thus a loss in open-circuit voltage of photovoltaic cells made on substrates with such a texture. A spiky texture is also less desirable because, when forming an emitter by diffusion of an n-type dopant, e.g. phosphorous, at the sharp peaks of the texture a heavily doped region or dead layer is formed, leading to an increased carrier recombination and a loss in short-circuit current density of photovoltaic cells made on such a substrate. In view of this, less sharp peaks leading to a smaller dead layer are preferred. Also in view of realizing a good ohmic contact between metal fingers and the textured surface, a less spiky surface texture may be preferred.

A texturing process according to one embodiment comprises two dry etching steps.

In a first step an $SF_6/N_2O$ plasma (or otherwise referred to throughout the description as a plasma based on a mixture comprising $SF_6$ and $N_2O$) is used for chemical etching of the surface by fluorine (F) radicals, leading to a spiky surface structure as illustrated in FIG. 5 and FIG. 6.

In a second plasma etching step this spiky surface structure is smoothened by chemical isotropic etching by fluorine (F) radicals, thereby removing the sharpest peaks or structures.

The process parameters of the second plasma etching are preferably such that the silicon at the peaks of the spiky surface texture is etched substantially faster than the silicon in the valleys in between the spikes.

According to one embodiment, smoothening by chemical isotropic etching (second step) of the spiky surface texture resulting from the first etching step can for example be done by means of an $SF_6/Ar$ based plasma (or otherwise referred to throughout the description as a plasma based on a mixture comprising $SF_6$ and Ar).

Without wishing to be bound by theory, it is believed that diluting the plasma with a gas, e.g. Ar, leads to an increased chamber pressure and thus a reduction of the lifetime of the F radicals in the plasma and thus to a higher probability that the peaks of the texture are preferably etched and a lower probability that F radicals penetrate into the valleys in between the spikes. Instead of Ar, other noble gases such as He, Ne, Kr, Xe or halogen containing gasses can be used.

Figure 7:
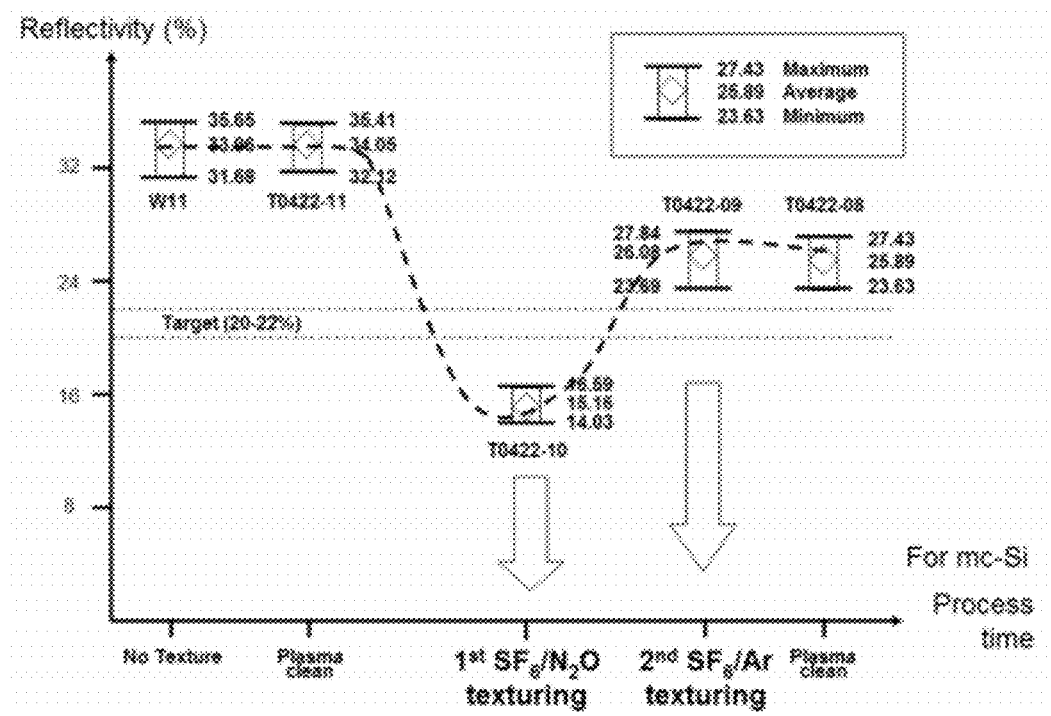
FIG. 7 shows the reflectivity of a multicrystalline silicon substrate for a two-step plasma texturing process according to one embodiment, as a function of the processing time.

FIG. 7 shows the result of reflectivity measurements on multicrystalline silicon substrates for a two-step plasma texturing process according to one embodiment wherein the second step is performed in an $SF_6/Ar$ plasma, as a function of the process time.

It can be observed that the second plasma etching leads to an increased reflectivity as compared to the reflectivity that is obtained after the first plasma etching. This may lead to a reduction in short-circuit current density for photovoltaic cells made on such a substrate.

Figure 8:
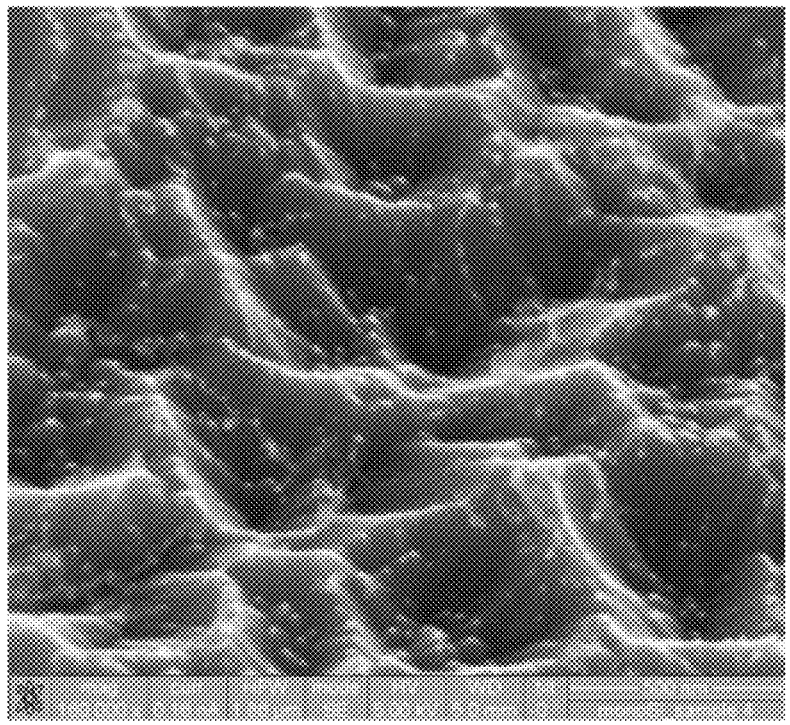
FIG. 8 shows a SEM picture of the surface texture of a multicrystalline silicon substrate after a two-step plasma texturing process of one embodiment.

As can be seen in the SEM picture of FIG. 8, the second plasma etching smoothens the spiky surface texture that is observed after the first plasma etching. It can be expected that this may lead to an increase in open-circuit voltage for photovoltaic cells made on such a substrate.

In one embodiment, smoothening by chemical isotropic etching (second step) of the spiky surface texture resulting from the first etching can also be done by using a higher working pressure, i.e. a working pressure that is substantially higher than the working pressure used in the first step of a method according to one embodiment.

Without wishing to be bound by theory, it is believed that a higher working pressure leads to a lower radical lifetime, and thus to less penetration of F radicals into the valleys.

The two-step plasma texturing process of one embodiment can be optimized to obtain an optimum balance between short-circuit current density and open-circuit voltage of photovoltaic cells.

The observations from the SEM pictures shown in FIG. 5 and FIG. 6 lead to the following conclusions. The first $SF_6/N_2O$ etching (i.e. an etching using (or in) a plasma based on a mixture comprising $SF_6$ and $N_2O$) creates a spiky surface texture that may result in the lowest reflectivity. Based on experiments with photovoltaic cells, it can be concluded that such a spiky textured surface may lead to an increase in the short-circuit current density $J_{sc}$, but a loss in the open-circuit voltage $V_{oc}$ as compared to non-textured photovoltaic cells. The loss in open-circuit voltage is related to the enlarged surface of the spiky surface texture as compared to a non-textured surface. Subsequently the second step, e.g. (preferably) $SF_6/Ar$ etching (i.e. an etching using (or in) a plasma comprising (or based on) a mixture comprising $SF_6$ and Ar), smoothens the surface texture, leading to an increase in reflectivity. This may lead to a higher open-circuit voltage $V_{oc}$ (due to smoothening of the surface) with little or no drop in short-circuit current density $J_{sc}$. A drop in $J_{sc}$ can be expected because of the increased reflectivity, but other parameters have an influence on $J_{sc}$. For example, a smoother surface texture may lead to a reduction of a dead layer in the emitter of a photovoltaic cell and may thus have a positive effect on the short-circuit current density. When optimizing the surface texturing process for obtaining the best photovoltaic cell efficiency, a trade-off can be made between a good $J_{sc}$ and a good $V_{oc}$. This can be adjusted or tailored by optimization of the two plasma texturing steps. The parameters of an optimized texturing process may also be dependent on other process steps used in the photovoltaic cell manufacturing process, such as for example emitter diffusion, surface passivation, ARC (Anti Reflection Coating) deposition, etc.

A series of experiments was done to study the electrical performance of aluminum backside field (ALBSF) photovoltaic cells, wherein the front surface was textured with a plasma texturing process according to one embodiment, and wherein at the back side a back surface field (BSF) was formed by Al diffusion (from a screen printed paste) into the silicon.

As a reference, photovoltaic cells were made on non-textured substrates after saw damage removal (4 minutes etching in NaOH+10 Minutes HCl) and on iso-texture substrates (wet acidic texture based on a solution comprising HF and $HNO_3$ in $CH_3CO_2H$). For these experiments mono-crystalline silicon substrates with a size of 100 mm×100 mm and a substrate thickness of 168 micrometer to 190 micrometer were used, as well as multi-crystalline silicon substrates with a size of 125 mm×125 mm and a thickness between 129 micrometer and 148 micrometer.

Three different texturing processes were used:
Group 1: $SF_6/N_2O$ (first plasma etching)+$SF_6/Ar$ (second plasma etching) according to one embodiment. The first plasma etching was performed in a 60 sccm $SF_6$/120 sccm $N_2O$ mixture at a pressure of 300 microbar and a 110 seconds etching time. The second plasma etching was performed in a 12 sccm $SF_6$/90 sccm Ar mixture at a pressure of 200 microbar and a 75 seconds etching time.
Group 2: Iso-texturing (wet acidic texture based on a solution comprising HF and $HNO_3$ in $CH_3CO_2H$)
Group 3: Saw damage removal (SDR) substrates, without any surface texturing.

Table 1 shows the current-voltage characteristics of photovoltaic cells made on the different substrates and with the different texturing processes.

The reflectivity shown in Table 1 is the reflectivity at a wavelength of 700 nm. The results shown on monocrystalline silicon substrates (mo-Si) represent average values of two cells. The results shown for multicrystalline substrates (mc-Si) represent average values for 20 cells (Group 1) and 6 cells (Group 2).

It is to be understood that all experiments mentioned throughout the description have been carried out under standard test conditions (STC).

TABLE 1

| Texturing | Substrate | Reflectivity at 700 nm [%] | $J_{sc}$ [mA/cm$^2$] | $V_{oc}$ [mV] | FF [%] | Efficiency [%] |
|---|---|---|---|---|---|---|
| Group 1 | mo-Si 168 μm | 24.20 | 33.7 | 622 | 77.8 | 16.3 |
|  | mc-Si | 24.71 | 32.6 | 614 | 76.9 | 15.4 |
| Group 2 | mo-Si 190 μm | 18.50 | 34.1 | 613 | 76.7 | 16.0 |
|  | mc-Si 174 μm | 18.21 | 33.0 | 603 | 76.0 | 15.1 |
| Group 3 | mo-Si 168 μm | 32.55 | 33.1 | 621 | 76.0 | 15.6 |

From these results it can be concluded that photovoltaic cells made on a substrate that is textured according to one embodiment, deliver excellent results compared to cells with iso-texturing (wet acidic texture) or non-textured cells.

As will be apparent to the skilled person, FF represents the Fill Factor which gives an indication on how much of the open circuit voltage and short circuit current is "utilized" at maximum power in the corresponding photovoltaic cells (the FF being the ratio of the maximum power to the product of the open-circuit voltage and the short-circuit current).

Additional experiments were performed on multicrystalline substrates with a first group of substrates (Group I) that received a two-step plasma texturing process according to one embodiment and a second group of substrates (Group II) that only received the first plasma texturing.

The first plasma texturing was performed in a 60 sccm $SF_6$/120 sccm $N_2O$ mixture at a pressure of 300 microbar and a 110 seconds etching time. The second plasma texturing (for Group I) was performed in a 12 sccm $SF_6$/90 sccm Ar mixture at a pressure of 200 microbar and a 30 seconds etching time.

The characteristics of photovoltaic cells made on these substrates are shown in Table 2 (average values for 4 cells are shown).

TABLE 2

| Texturing | Substrate | Reflectivity at 700 nm [%] | $J_{sc}$ [mA/cm$^2$] | $V_{oc}$ [mV] | FF [%] | Efficiency [%] |
|---|---|---|---|---|---|---|
| Group I | mc-Si | 17.69 | 33.3 | 610 | 77.6 | 15.8 |
| Group II | mc-Si | 14.37 | 32.7 | 607 | 77.5 | 15.4 |

The results of Table 2 show that performing the second etching results in an increase of the reflectivity as compared to the reflectivity obtained after the first etching.

Figure 10:
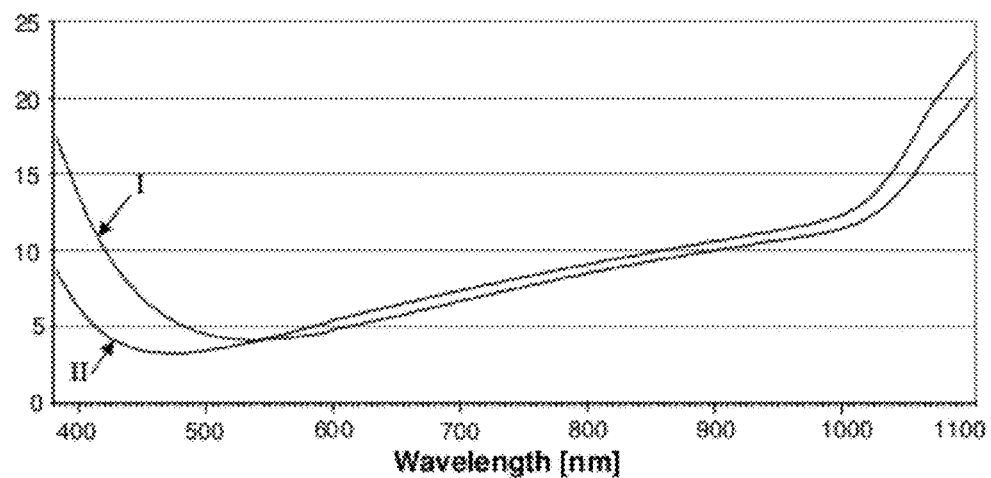
FIG. 10 shows the measured reflectivity at the surface of a multicrystalline silicon photovoltaic cell, for a cell that only received the first dry etching and for a cell that received the first and the second dry etching according to one embodiment of the present invention.

FIG. 10 shows the measured reflectivity as a function of the wavelength for a cell from Group I (indicated with I) and for a cell from Group II (indicated with II). In the example shown, an increase in reflectivity after performing the second etching is observed for wavelengths lower than about 550 nm. The second etching also leads to an increase in open-circuit voltage, but in the example shown it does not lead to a decrease in short-circuit current density, despite the increased reflectivity.

Figure 11:
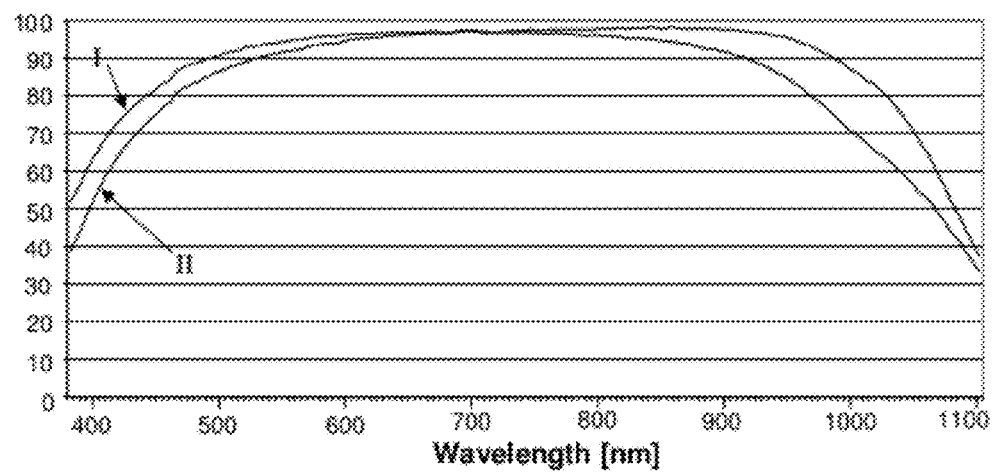
FIG. 11 shows the measured internal Quantum Efficiency for a multicrystalline silicon photovoltaic cell, for a cell that only received the first dry etching and for a cell that received the first and the second dry etching according to one embodiment of the present invention.

FIG. 11 shows the measured internal quantum efficiency (IQE) as a function of the wavelength for a cell from Group I (indicated with I) and for a cell from Group II (indicated with II). For wavelengths lower than about 700 nm the IQE of a cell that received both etching steps (Group I) is larger than the IQE of a cell that only received a single etching step (Group II).

Without wishing to be bound by theory, it is believed that the higher IQE in this wavelength range can be related to a lower surface recombination velocity due to smoothening of the surface resulting from the second etching. This lower surface recombination leads to an increase in open-circuit voltage and may have a positive effect on the short-circuit current density. As described above, a smoother surface texture may also lead to a reduction of a dead layer in the emitter of a photovoltaic cell and may thus have a positive effect on the short-circuit current density.

A higher cell efficiency is obtained for the photovoltaic cells made on a substrate textured according to a two-step process of one embodiment, as compared to the cells made on a substrate that only received a single plasma texturing step.

Using the two-step plasma texturing process according to one embodiment, industrial i-PERC type photovoltaic cells with a passivation stack on the rear side were manufactured on multi-crystalline silicon substrates with a size of 125 mm×125 mm and a substrate thickness in the range between 129 micrometer and 148 micrometer.

Three groups of solar cells were processed:
Group a: $SF_6/N_2O$ (first plasma etching)+$SF_6$/Ar (second plasma etching) according to one embodiment, and Al Back Surface Field. The first plasma etching was performed in a 60 sccm $SF_6$/120 sccm $N_2O$ mixture at a pressure of 300 microbar and a 110 seconds etching time. The second plasma etching was performed in a 12 sccm $SF_6$/90 sccm Ar mixture at a pressure of 200 microbar and a 75 seconds etching time.
Group b: Same plasma texturing as Group a, and standard i-PERC passivation stack ($SiO_x/SiN_x$) on the rear.
Group c: Same plasma texturing as Group a, and alternative i-PERC passivation stacks ($Al_2O_3/SiN_x$) on the rear.

The current-voltage characteristics of these cells are shown in Table 3, for cells with and without FGA (Forming Gas Anneal) treatment. The FGA treatment is performed during 20 minutes at a temperature of 400° C.

The characteristics of Group a are average results for 20 photovoltaic cells, Group b and Group c show the average of 2 cells.

TABLE 3

| Process | FGA | $J_{sc}$ [mA/cm$^2$] | $V_{oc}$ [mV] | FF [%] | Efficiency [%] |
|---|---|---|---|---|---|
| Group a | no | 32.6 | 614 | 76.9 | 15.4 |
|  | yes | 32.4 | 613 | 78.2 | 15.6 |
| Group b | no | 32.8 | 621 | 73.7 | 15.0 |
|  | yes | 33.0 | 622 | 77.8 | 16.0 |
| Group c | no | 32.6 | 607 | 74.2 | 14.7 |
|  | yes | 32.2 | 609 | 78.1 | 15.3 |

From these results it can be concluded that the two-step plasma texturing process of one embodiment can advantageously be used in a fabrication process for i-PERC photovoltaic cells.

It is an advantage of the plasma texturing method of one embodiment that it can be used for texturing thin photovoltaic cells such as epitaxial and thin film poly-crystalline silicon photovoltaic cells.

The first etching leads to a substantial reduction of the reflectivity of the substrate and a spiky surface texture.

In the second step the spike tips are etched and the surface area is reduced.

Both plasma etching steps can be done in a single run within the same plasma reactor without breaking the vacuum conditions.

Texturing methods according to one embodiment can for example be implemented in large scale production tools, e.g.

in-line systems with high throughput, for example allowing a throughput of about 1200 to 2400 substrates per hour. It is an advantage that in the method of one embodiment the use of chlorine gas is avoided.

Without wishing to be bound by theory, it is believed that the interaction between fluorine (F) radicals and silicon is based on penetration of fluorine (F) radicals into the fluorinated (fluorosilyl) silicon surface and breakage of the subsurface bonding of Si—Si. After the F radical reaction with silicon, it may form free radicals $SiF_2$ and a (stable) end product of $SiF_4$. The $SiF_2$ is estimated to form about 5-30% of the etch products and the majority is $SiF_4$ which is volatile and can be pumped away.

In the first plasma etching of a process according to one embodiment, important parameters are the F:O ratio (related to the $SF_6$:$N_2O$ ratio) and the working pressure.

Without wishing to be bound by theory, it is believed that the oxygen (e.g. $N_2O$) added to the $SF_6$ plasma has two different effects. A first effect is enhancement of the $SF_6$ molecular dissociation by O radicals. This increase of $SF_6$ dissociation leads to a higher silicon etching rate. Secondly, when enough $O_2$ is added, O chemisorbs on the silicon surface making it more "oxide-like" such that the etching is reduced. When the $O_2$ concentration is low, F-radicals react actively with the silicon and no oxidation layer is formed. However, when the $O_2$ concentration is increased (i.e. the $SF_6/N_2O$ ratio is lower, e.g. less than 0.5 such that $N_2O$ is in surplus or in excess), an oxidation layer comprising $SiO_x$ and/or $SiF_xO_y$ is created by a chemical reaction between the surplus (or excess) of oxygen and the silicon surface or the etch products. The re-deposition of such an oxidation layer and silicon etching by F-radicals occur simultaneously. Due to the etch selectivity between $SiO_x$ and Si, a rough texture is created and the etch rate of F-radicals is reduced. In one embodiment, the oxygen can originate from the dissociation of $N_2O$ gas. The etch rate can be increased with the addition of nitrogen. During the oxygen plasma discharge, an oxide ($SiF_xO_y$) layer comprising Si, O and F is formed. NO, which is a strong product from $N_2O$ dissociation, arrives at the surface and attacks the Si—O bonds to form $NO_2$. This removal of an oxygen atom results in a dangling bond of the silicon atom. The dangling bond can react with F-radicals.

Without wishing to be bound by theory, it is believed that pressure plays an important role in the first step of a texturing process according to one embodiment. At lower pressures the ion energy is higher. Thus, at lower pressures the F-radicals travel at higher speed and they have a longer radical lifetime due to the higher mean-free path. This may lead to a larger penetration of the F-radicals into the silicon surface. As a result, a spiky surface texture with steep spikes can be generated.

Without wishing to be bound by theory, it is believed that the first step of the plasma texturing process according to one embodiment is based on a chemical reaction of F radicals with silicon. Fluorine radicals etch silicon while the oxygen present in the plasma oxidizes the silicon of the silicon-fluorine etching residues. These oxides are locally re-deposited and their locally and temporally masking leads to a dynamic equilibrium that results in a texture formation.

In one embodiment, the plasma comprising (or consisting of) fluorine (F) radicals and oxygen (O) radicals, used for performing the first dry etching, is provided by a mixture of (etchant) gasses comprising (or consisting of) a fluorine comprising gas and an oxygen comprising gas, wherein the fluorine comprising gas preferably comprises (or consists of) $SF_6$, $COF_2$, $CF_4$, $NF_3$, $SiF_4$, $F_2$ diluted in $N_2$, or any combinations thereof; and the oxygen comprising gas preferably comprises (or consists of) $N_2O$, $O_2$, or any combinations thereof. Preferably, the fluorine comprising gas used for performing the first dry etching is selected from the group consisting of $SF_6$, $COF_2$, $CF_4$, $NF_3$, $SiF_4$, $F_2$ diluted in $N_2$, or any combinations thereof.

More preferably, the fluorine comprising gas is selected to be (or comprise) $SF_6$.

In a preferred aspect, the oxygen comprising gas used for performing the first dry etching is selected from the group consisting of $N_2O$, $O_2$, or any combinations thereof. More preferably, the oxygen comprising gas is selected to be (or comprise) $N_2O$.

As will be apparent to the skilled person, any combinations between (any elements of the group consisting of $SF_6$, $COF_2$, $CF_4$, $NF_3$, $SiF_4$, $F_2$ diluted in $N_2$, or any combinations thereof) and (any elements of the group consisting of $N_2O$, $O_2$, or any combinations thereof) may be used in one embodiment for performing the first dry etching of the method according to one embodiment.

Such exemplary combinations comprise, but are not limited to: $SF_6/N_2O$, $COF_2/N_2O$, $CF_4/N_2O$, $NF_3/N_2O$, $SiF_4/N_2O$, $F_2$ diluted in $N_2/N_2O$, $SF_6/O_2$, $COF_2/O_2$, $CF_4/O_2$, $NF_3/O_2$, $SiF_4/O_2$, or $F_2$ diluted in $N_2/O_2$.

Preferably, the gas ratio between the fluorine comprising gas and the oxygen comprising gas used in the first dry etching, is between about 0.2 and 1.0, particularly between about 0.3 and 0.7, more particularly between about 0.4 and 0.6, more particularly the gas ratio between the fluorine comprising gas and the oxygen comprising gas is about 0.5.

In one embodiment, the first dry etching comprises (or consists of) etching the surface of the substrate in a plasma comprising (or based on) a mixture comprising (or consisting of) $SF_6$ and $N_2O$.

In one embodiment, the $SF_6/N_2O$ gas ratio is preferably comprised between about 0.2 and 1.0, particularly between about 0.3 and 0.7, more particularly between about 0.4 and 0.6, and more particularly the $SF_6/N_2O$ gas ratio is about 0.5.

In one embodiment, the first dry etching is performed at a working pressure comprised between (about) 0.5 microbar and (about) 1000 microbar, preferably between (about) 50 microbar and (about) 500 microbar, more preferably between (about) 50 microbar and (about) 300 microbar, even more preferably between (about) 250 microbar and (about) 300 microbar, most preferably at (about) 300 microbar.

In one embodiment, the first dry etching is performed at a working pressure lower than about (500) microbar.

In one embodiment, the first dry etching is performed at a working pressure comprised between (about) 150 microbar and (about) 400 microbar.

In one embodiment, the etching time of the first dry etching is in the range between (about) 60 seconds and (about) 240 seconds, more preferably between (about) 60 seconds and (about) 150 seconds.

The etching time of the first dry etching may be in the range between (about) 1 and (about) 4 minutes (or between about 60 seconds and about 240 seconds).

The etching time of the first dry etching may be in the range between (about) 40 seconds and (about) 180 seconds.

As mentioned above, a gas mixture comprising $SF_6$ and $N_2O$ can be used for performing the first dry etching, but other mixtures can be used. For example, $SF_6$ can be replaced by other gases such as $COF_2$, $CF_4$, $NF_3$, $SiF_4$ or $F_2$ diluted in $N_2$ and/or $N_2O$ can be replaced by $O_2$.

A typical gas ratio between $SF_6$ and $N_2O$ is in the range between about 0.2 and 1.5, preferably in the range between about 0.2 and 1.0, e.g. (more preferably) in the range between about 0.3 and 0.7, e.g. (most preferably) about 0.5.

The total gas flow is preferably in the range between about 50 sccm and 5000 sccm, depending of the chamber capacity, for example a total gas flow in the range between about 100 sccm and 1000 sccm, e.g. (preferably) in the range between about 100 sccm and 300 sccm may be used.

The pressure is typically in the range between about 0.5 microbar and 1000 microbar, e.g. (preferably) in the range between about 50 microbar and 500 microbar, e.g. (more preferably) in the range between about 50 microbar and 300 microbar.

The etching time of this first step can be controlled for obtaining the lowest reflectivity at a wavelength of e.g. about 600 nm or 700 nm, and is typically in the range between about 1 and 4 minutes.

The second step of the plasma texturing process of one embodiment is based on a chemical reaction of F radicals with silicon.

In one embodiment, the plasma comprising fluorine (F) radicals, used for performing the second dry etching, is provided by a mixture of etchant gasses comprising (or consisting of) a fluorine comprising gas, wherein the fluorine comprising gas preferably comprises (or consists of) $SF_6$, $COF_2$, $CF_4$, $NF_3$, $SiF_4$, $F_2$ diluted in $N_2$, or any combinations thereof.

In one embodiment, the fluorine comprising gas used for performing the second dry etching is selected from the group consisting of $SF_6$, $COF_2$, $CF_4$, $NF_3$, $SiF_4$, $F_2$ diluted in $N_2$, or any combinations thereof. More preferably, the fluorine comprising gas is selected to be (or comprise) $SF_6$.

In one embodiment, the second dry etching comprises (or consists of) etching in a plasma comprising a diluting gas, wherein the diluting gas preferably comprises (or consists of) Ar, He, Ne, Kr, Xe, halogen element comprising gases, or any combinations thereof.

In one embodiment, the diluting gas comprises (or consists of) Ar. As will be apparent to the skilled person, any combinations between (any elements of the group consisting of $SF_6$, $COF_2$, $CF_4$, $NF_3$, $SiF_4$, $F_2$ diluted in $N_2$, or any combinations thereof) and (any elements of the group consisting of Ar, He, Ne, Kr, Xe, halogen element comprising gases, or any combinations thereof) may be used in one embodiment for performing the second dry etching of the method. Such exemplary combinations comprise, but are not limited to: $SF_6$/Ar, $COF_2$/Ar, $CF_4$/Ar, $NF_3$/Ar, $SiF_4$/Ar, $F_2$ diluted in $N_2$/Ar, $SF_6$/$Cl_2$, $COF_2$/He, $CF_4$/Ne, $NF_3$/Kr, $SiF_4$/Xe, or $F_2$ diluted in $N_2$/He.

In one embodiment, the gas ratio between the fluorine comprising gas and the diluting gas, is preferably comprised between (about) 0.05 and (about) 0.5, more preferably between (about) 0.05 and (about) 0.3, even more preferably between (about) 0.1 and (about) 0.15, most preferably the gas ratio between the fluorine comprising gas and the diluting gas is (about) 0.13.

In one embodiment, the second dry etching is performed in a plasma comprising (or based on) a mixture comprising (or consisting of) $SF_6$ and Ar. The $SF_6$/Ar gas ratio may be between (about) 0.05 and (about) 0.5, preferably between (about) 0.05 and (about) 0.3, more preferably between (about) 0.1 and (about) 0.15, most preferably the $SF_6$/Ar gas ratio between the fluorine comprising gas and the diluting gas is (about) 0.13.

In one embodiment, the second dry etching is performed at a working pressure comprised between (about) 100 microbar and (about) 1000 microbar, preferably between (about) 150 microbar and (about) 500 microbar, more preferably between (about) 150 microbar and (about) 300 microbar, even more preferably between (about) 200 microbar and (about) 300 microbar, most preferably at (about) 250 microbar.

In one embodiment, the etching time of the second dry etching is in the range between (about) 30 and 400 seconds, preferably between (about) 30 and 300 seconds, more preferably between (about) 90 and 300 seconds, even more preferably between (about) 30 seconds and 150 seconds, most preferably between (about) 30 seconds and 70 seconds.

As mentioned above, in one embodiment, a gas mixture comprising $SF_6$ and Ar can be used, but other mixtures can be used. For example, $SF_6$ can be replaced by other gases such as $COF_2$, $CF_4$, $NF_3$, $SiF_4$ or $F_2$ diluted in $N_2$ and/or Ar can be replaced by noble gases such as He, Ne, Kr, Xe or halogen element containing gases.

The $SF_6$ gas flow can for example be in the range between about 10 sccm and 2000 sccm, e.g. (preferably) in the range between about 10 sccm and 1000 sccm, e.g. (more preferably) in the range between about 10 sccm and 500 sccm, e.g. (even more preferably) in the range between about 10 sccm and 100 sccm.

The Ar gas flow can for example be in the range between about 50 sccm and 5000 sccm, e.g. (preferably) in the range between about 50 sccm and 2000 sccm, e.g. (more preferably) in the range between about 50 sccm and 1000 sccm, e.g. (even more preferably) in the range between about 50 sccm and 500 sccm, e.g. (most preferably) in the range between about 50 sccm and 200 sccm.

The $SF_6$/Ar gas ratio may be in the range between about 0.05 and 0.5, e.g. (preferably) in the range between about 0.05 and 0.3, e.g. (more preferably) in the range between about 0.1 and 0.15.

The pressure is (preferably) in the range between about 100 microbar and 1000 microbar.

A typical etching time is in the range between about 30 seconds and 400 seconds, e.g. (preferably) between about 30 seconds and 300 seconds, e.g. (more preferably) between about 90 seconds and 300 seconds.

During the second plasma texturing step, the surplus of Argon atoms is ionized by the electron impact with microwave energy, thereby forming $Ar^+$ ions.

Without wishing to be bound by theory, it is believed that Argon can enhance the dissociation of the fluorine plasma and reduce the lifetime of the F radicals due to the higher working pressure resulting from the dilution with Ar gas. The $Ar^+$ does not chemically react with silicon atoms. A small amount of $SF_6$ is used during the second plasma texturing step. The F radicals are the main element to have an isotropic chemical reaction with silicon atoms at the rough surface, thereby smoothening the spiky surface texture. The etch rate depends not only on the local properties of the surface, but also on the surrounding environment. For example, on the rough surface created after the first plasma texturing step, a "shadowing" effect may occur. The peaks of the texture surface may receive more fluorine radicals. The atoms strike the texture peaks or spikes from random angles, such that the peaks of the texture etch faster than the valleys.

In one embodiment, the second dry etching is performed at a working pressure that is higher than the working pressure used during the first dry etching, preferably the second dry etching is performed at a working pressure that is higher than (about) 500 microbar, more preferably higher than (about) 1000 microbar. The plasma comprising (or consisting of) fluorine (F) radicals, used for performing the second dry etching, may be provided by a mixture of (etchant) gasses comprising (or consisting of) a fluorine comprising gas and an oxygen comprising gas, wherein the fluorine comprising gas preferably comprises (or consists of) $SF_6$, $COF_2$, $CF_4$, $NF_3$, $SiF_4$, $F_2$ diluted in $N_2$, or any combinations thereof; and the oxygen comprising gas preferably comprises (or consists of) $N_2O$, $O_2$, or any combinations thereof. In such embodiments, the second dry etching may for example be performed in a $SF_6/N_2O$-based plasma. Other mixtures can be used. For example, $SF_6$ can be replaced by other gases such as $COF_2$, $CF_4$, $NF_3$, $SiF_4$ or $F_2$ diluted in $N_2$ and/or $N_2O$ can be replaced by $O_2$.

In one embodiment, the second dry etching is performed at a working pressure comprised between (about) 100 microbar and (about) 1000 microbar, preferably between (about) 400 microbar and (about) 600 microbar, also preferably between (about) 800 microbar and (about) 1000 microbar.

In an alternative aspect, the working pressure used during the second dry etching is substantially similar (or identical) to the working pressure used during the first dry etching.

Figure 9:
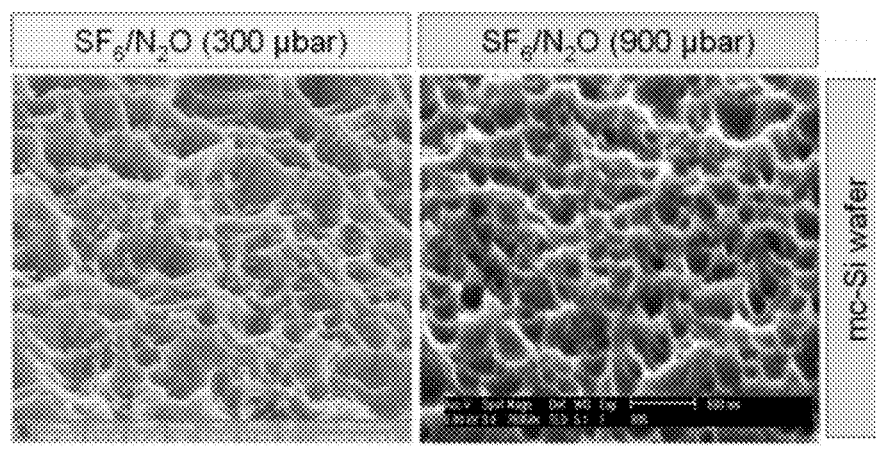
FIG. 9 shows SEM pictures of a monocrystalline silicon surface textured with a $SF_6/N_2O$ plasma at 300 microbar (left picture) and of a monocrystalline silicon surface textured with a $SF_6/N_2O$ plasma at 900 microbar (right picture).

As mentioned above, in one embodiment, smoothening by chemical isotropic etching (second step) of the spiky surface texture resulting from the first etching can be done by using a higher working pressure as compared to the working pressure used in the first etching, e.g. using the same or a similar plasma composition as it the first etching. To illustrate this, plasma texturing experiments were performed with different working pressures. By changing the pressure, the mobility and lifetime of the plasma radicals and ions can be changed. For higher pressures, the etch rate is lower and the surface texture is less spiky and more sponge-like (as illustrated in FIG. 9), leading to a higher reflectivity. FIG. 9 shows SEM pictures of a multicrystalline silicon surface textured with $SF_6/N_2O$ (60/120 sccm) at 300 microbar and with an etch time of 110 seconds (left picture) and of a multicrystalline silicon surface textured with $SF_6/N_2O$ (60/120 sccm) at 900 microbar with an etch time of 110 seconds (right picture). A spiky texture can be observed at 300 microbar, and a sponge-like texture at 900 microbar.

Experiments with different working pressures were done on multi-crystalline silicon substrates with a size of 125 mm×125 mm and a thickness in the range between 129 micrometer and 148 micrometer. All cells were completed with an Al BSF and FGA.

Four groups of samples were made:
Group A: saw damage removal (SDR) substrates, without any surface texturing;
Group B: $SF_6/N_2O$ (60 sccm/120 sccm) at 300 μbar for 110 s;
Group C: $SF_6/N_2O$ (60 sccm/120 sccm) at 900 μbar for 110 s;
Group D: $SF_6/N_2O$ (60 sccm/120 sccm) at 300 μbar for 110 s+$SF_6/N_2O$ (60 sccm/120 sccm) at 900 μbar for 110 s.

The current-voltage characteristics (average values for 4 cells per group) are summarized in Table 4.

TABLE 4

| Process | Reflectivity at 700 nm [%] | $J_{sc}$ [mA/cm2] | $V_{oc}$ [mV] | FF [%] | Efficiency [%] |
| --- | --- | --- | --- | --- | --- |
| Group A | 33.57 | 31.70 | 618 | 73.38 | 14.37 |
| Group B | 13.03 | 32.34 | 607 | 77.18 | 15.16 |
| Group C | 23.25 | 32.46 | 615 | 77.34 | 15.43 |
| Group D | 18.59 | 32.69 | 613 | 77.72 | 15.57 |

From the results reported in Table 4 it can be concluded that the photovoltaic cells of Group B show the lowest reflectivity. However, they do not show the best cell efficiency, due to a relatively low open-circuit voltage. This can be attributed to the spiky surface texture obtained after plasma texturing at 300 microbar. When this texturing step is followed by a second plasma texturing step at higher pressure (e.g. at 900 microbar), a very good balance between open-circuit voltage and short-circuit current density can be obtained (Group D). The results also show that a single plasma texturing step with $SF_6/N_2O$ at 900 microbar (Group C) leads to less efficient cells as compared to a two-step process. The cells of Group C, having a sponge-like surface texture, show a relatively high reflectivity.

In one embodiment, the method can advantageously be used for texturing a surface of photovoltaic cells.

It may lead to photovoltaic cells with a good (or improved) electrical performance (when compared to methods described in the art), e.g. with a good balance between short-circuit current density and open-circuit voltage.

One embodiment relates to the use of a method as above described for the manufacture of photovoltaic cells.

The method as above described can advantageously be used for the manufacture of i-PERC photovoltaic cells.

One embodiment relates to a photovoltaic cell made on a substrate textured according to the method as above described. For example, the photovoltaic cell can be of the i-PERC photovoltaic cell type.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A dry etching method of texturing a surface of a substrate, the method comprises:
    a) performing a first dry etching onto the surface of the substrate thereby forming a surface texture with spikes and valleys, the first dry etching comprising etching the surface of the substrate in a first plasma comprising fluorine (F) radicals and oxygen (O) radicals, wherein the ratio between oxygen radicals and fluorine radicals in the first plasma is greater than 1; and
    b) performing a second dry etching onto the surface texture thereby smoothening the surface texture, the second dry etching comprising chemical isotropic etching the surface texture obtained according to process a) in a second plasma comprising F radicals, wherein the spikes are etched substantially faster than the valleys.

2. The method according to claim 1, wherein the first plasma is provided by a mixture of gases comprising a fluorine-comprising gas and an oxygen-comprising gas, wherein the fluorine-comprising gas comprises SF6, COF2, CF4, NF3, SiF4, F2 diluted in N2, or any combinations thereof, and wherein the oxygen-comprising gas comprises N2O, O2, or any combinations thereof.

3. The method according to claim 2, wherein the gas ratio between the fluorine-comprising gas and the oxygen-comprising gas in the first plasma is between 0.2 and 1.0.

4. The method according to claim 1, wherein the first dry etching comprises etching the surface of the substrate in the first plasma based on a mixture comprising $SF_6$ and $N_2O$.

5. The method according to claim 4, wherein the SF6/N2O gas ratio is between 0.2 and 1.0.

6. The method according to claim 1, wherein the first dry etching is performed at a working pressure between 0.5 microbar and 1000 microbar.

7. The method according to claim 1, wherein the first dry etching is performed at a working pressure lower than about 500 microbar.

8. The method according to claim 1, wherein said the second plasma is provided by a mixture of gases comprising a fluorine-comprising gas, wherein the fluorine-comprising gas comprises $SF_6$, $COF_2$, $CF_4$, $NF_3$, $SiF_4$, $F_2$ diluted in $N_2$, or any combinations thereof.

9. The method according to claim 1, wherein the second dry etching comprises etching in the second plasma, the second plasma comprising a diluting gas, wherein the diluting gas comprises Ar, He, Ne, Kr, Xe, halogen element comprising gases, or any combinations thereof.

10. The method according to claim 9, wherein the gas ratio between the fluorine-comprising gas and the diluting-gas is between 0.05 and 0.5.

11. The method according to claim 9, wherein the second dry etching is performed in the second plasma based on a mixture comprising $SF_6$ and Ar.

12. The method according to claim 11, wherein the $SF_6$/Ar gas ratio is between 0.05 and 0.5.

13. The method according to claim 9, wherein the second dry etching is performed at a working pressure between 100 microbar and 1000 microbar.

14. The method according to claim 1, wherein the second dry etching comprises etching in the second plasma, the second plasma further comprising a diluting gas, wherein the diluting gas comprises Ar.

15. The method according to claim 1, wherein the second dry etching is performed at a working pressure that is higher than the working pressure used during the first dry etching.

16. The method according to claim 15, wherein said the second plasma is provided by a mixture of gases comprising a fluorine-comprising gas and an oxygen-comprising gas, wherein the fluorine-comprising gas comprises $SF_6$, $COF_2$, $CF_4$, $NF_3$, $SiF_4$, $F_2$ diluted in $N_2$, or any combinations thereof, and wherein the oxygen-comprising gas comprises $N_2O$, $O_2$, or any combinations thereof.

17. The method according to claim 1, wherein the second dry etching is performed at a working pressure that is higher than 500 microbar.

18. A method according to claim 1, wherein the method is performed in a reactor with a microwave induced plasma without confinement of radicals towards the substrate.

19. A method of manufacturing a photovoltaic cells, the method comprising texturing a surface of a substrate according to the method of claim 1.

* * * * *